United States Patent [19]

Wloka et al.

[11] Patent Number: 5,519,848
[45] Date of Patent: May 21, 1996

[54] METHOD OF CELL CHARACTERIZATION IN A DISTRIBUTED SIMULATION SYSTEM

[75] Inventors: Markus G. Wloka; Binay J. George; Sean C. Tyler, all of Chandler, Ariz.

[73] Assignee: Motorola, Inc., Schaumburg, Ill.

[21] Appl. No.: 154,054

[22] Filed: Nov. 18, 1993

[51] Int. Cl.[6] .............................. G06F 3/00; G06G 7/48
[52] U.S. Cl. ................... 395/500; 395/650; 395/800; 395/700; 395/183.09; 395/189.01; 364/578; 364/DIG. 1; 364/DIG. 2
[58] Field of Search .......................... 395/500, 124, 395/127, 800, 550, 280, 183.09, 650, 900, 916, 700, 184.01, 375; 364/DIG. 1, DIG. 2, 578, 140, 481, 488–491, 724.12, 264, 401, 716, 132

[56] References Cited

U.S. PATENT DOCUMENTS

| | | | |
|---|---|---|---|
| 4,456,994 | 6/1984 | Segarra | 395/500 |
| 4,872,125 | 10/1989 | Catlin | 364/578 |
| 4,916,647 | 4/1990 | Catlin | 364/578 |
| 4,982,361 | 1/1991 | Miyaoka et al. | 395/500 |
| 5,091,872 | 2/1992 | Agrawal | 364/578 |
| 5,093,920 | 3/1992 | Agrawal et al. | 395/800 |
| 5,157,778 | 10/1992 | Bischoff et al. | 395/500 |
| 5,375,074 | 12/1994 | Greenberg et al. | 364/578 |
| 5,392,429 | 2/1995 | Agrawal et al. | 395/650 |
| 5,442,772 | 8/1995 | Childs et al. | 364/578 |

*Primary Examiner*—Kevin J. Teska
*Assistant Examiner*—Jacques H. Louis-Jacques
*Attorney, Agent, or Firm*—Robert D. Atkins

[57] ABSTRACT

A method executed by a computer program performs cell characterization in a distributed simulation system by partitioning characterization tasks into individual simulations. A simulation job is generated based on the individual simulations and placed into a simulation job queue. The simulation job queue is copied into a database. The simulation job is accessed and processed in a remote simulator. The remote simulator returns a simulation status and simulation results which are placed into an acknowledge queue. The simulation process is repeated upon detecting an error condition from the simulation status. The simulation status is read from the acknowledge queue and the acknowledge queue is copied into the database.

4 Claims, 2 Drawing Sheets

METHOD OF CELL CHARACTERIZATION IN A DISTRIBUTED SIMULATION SYSTEM

BACKGROUND OF THE INVENTION

The present invention relates in general to software engineering and, more particularly, to a method of distributed cell characterizations executed by a computer program.

Standard cells are circuits which provide specific, predefined functionality for chip designers. When used as building blocks for more complex systems such as microprocessors, the cells and the larger circuits built from the cells must be fully simulated with a circuit simulator such as SPICE prior to fabrication. The computer simulation is a useful step during the design of an electronic circuit to test the various features before a physical embodiment is built. The circuit may be mathematically modeled in the computer simulator whereby the design parameters may be verified or manipulated to work out the inevitable problems associated with different embodiments before proceeding with the cost and effort of building an actual model.

Timing and power characteristics—that is, how quickly the circuit can be cycled and how many watts are consumed during active and idle modes—are primary concerns and must be evaluated for a range of operating temperatures, supply voltages, etc. Because SPICE simulation time grows more than linearly with circuit size, full analog simulations of large semi-custom designs are extraordinarily time-consuming jobs. Each may take many hours to complete even on modern mainframe and mini-supercomputer systems.

Entice is a cell characterization system that approximates analog methods to deliver much shorter solution times and higher throughput on such simulation jobs. Instead of performing a sequential simulation of the complete design, Entice performs smaller simulations of each design's building blocks in one or more workstations. The performance of the complete design is then approximated by forming sums along those components. The total timing delay, for instance, is approximately equal to the sum of the timing delays along the longest path in the overall design. For power, total consumption is approximately equal to the sum of the power consumed by all of the parts.

The bottleneck in cell characterization is the circuit simulation, where each cell in a library is simulated over a range of parameters (input edge rate, output loading, supply voltage, temperature, etc.) to obtain delay parameter relationships. For an average library of say one hundred cells, the number of simulations frequently runs into the tens of thousands.

Hence, a need exists to reduce simulation time as cells and circuits grow more complex.

DETAILED DESCRIPTION OF THE PREFERRED EMBODIMENT

Semicustom design is a hardware design style where a design is composed of pre-build standard cells. The behavior, e.g. timing and power of a circuit, is approximated by the composite behavior of the cells. Cell characterization is the measurement of the standard cell over a range of parameters, such as temperature (T), edge rate (ER), supply voltage ($V_{DD}$), process, logic input assignment (L), pin capacitive loading (C), and other parameters by simulation with a circuit simulator such as Spice.

For the implementation of the present invention, the Linda computer language may be used. Linda is a coordination computer language for asynchronous parallel processing. Linda includes a host language, such as Fortran or C, plus an associative distributed Memory, called tuple space, and operations IN (), OUT (), READ (), and EVAL() to write data, read and remove data, read data, and start a remote simulator, respectively.

Figure 1:
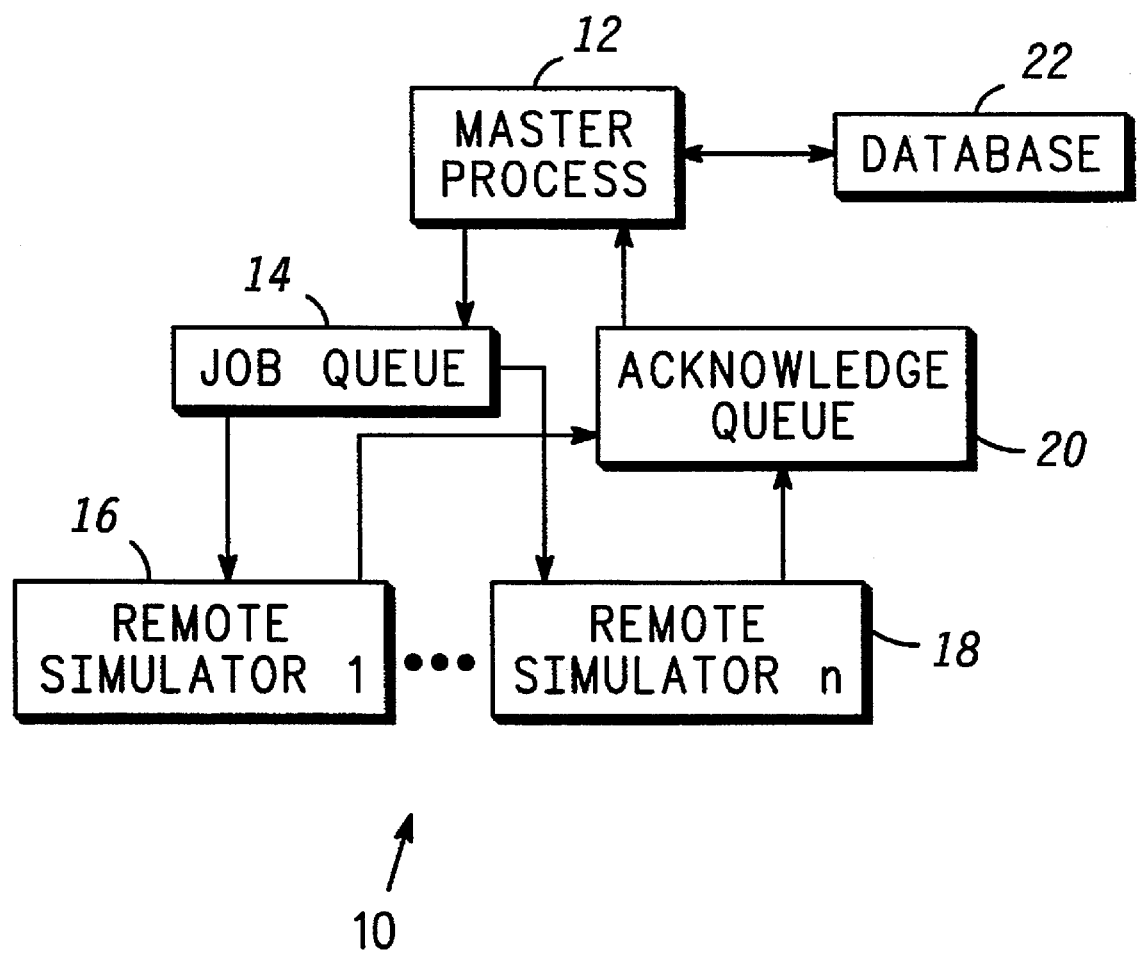
FIG. 1 is a dataflow diagram that shows scheduling and parallel processing in a distributed simulation system.

The dataflow is shown in FIG. 1 including a master process 12, the Linda tuple space including job queue 14 and acknowledge queue 20, a persistent database 22, and multiple remote simulators 16 and 18 doing the remote simulations. The necessary hardware includes remote workstations linked together by a low-bandwidth computer network. Communication bandwidth requirements are minimal.

A queue is a list of messages. Messages are written to the queue head and are read from the queue tail so that the first message to enter the queue is also the first message to leave the queue, i.e. first-in-first-out processing. Semaphores are variables that can only be read by one computational process at a time. The semaphores regulate access to the queue head and tails. The tuple space includes job queue 14 and acknowledge queue 20 for performing preemptive scheduling and load-balancing.

Figure 2:
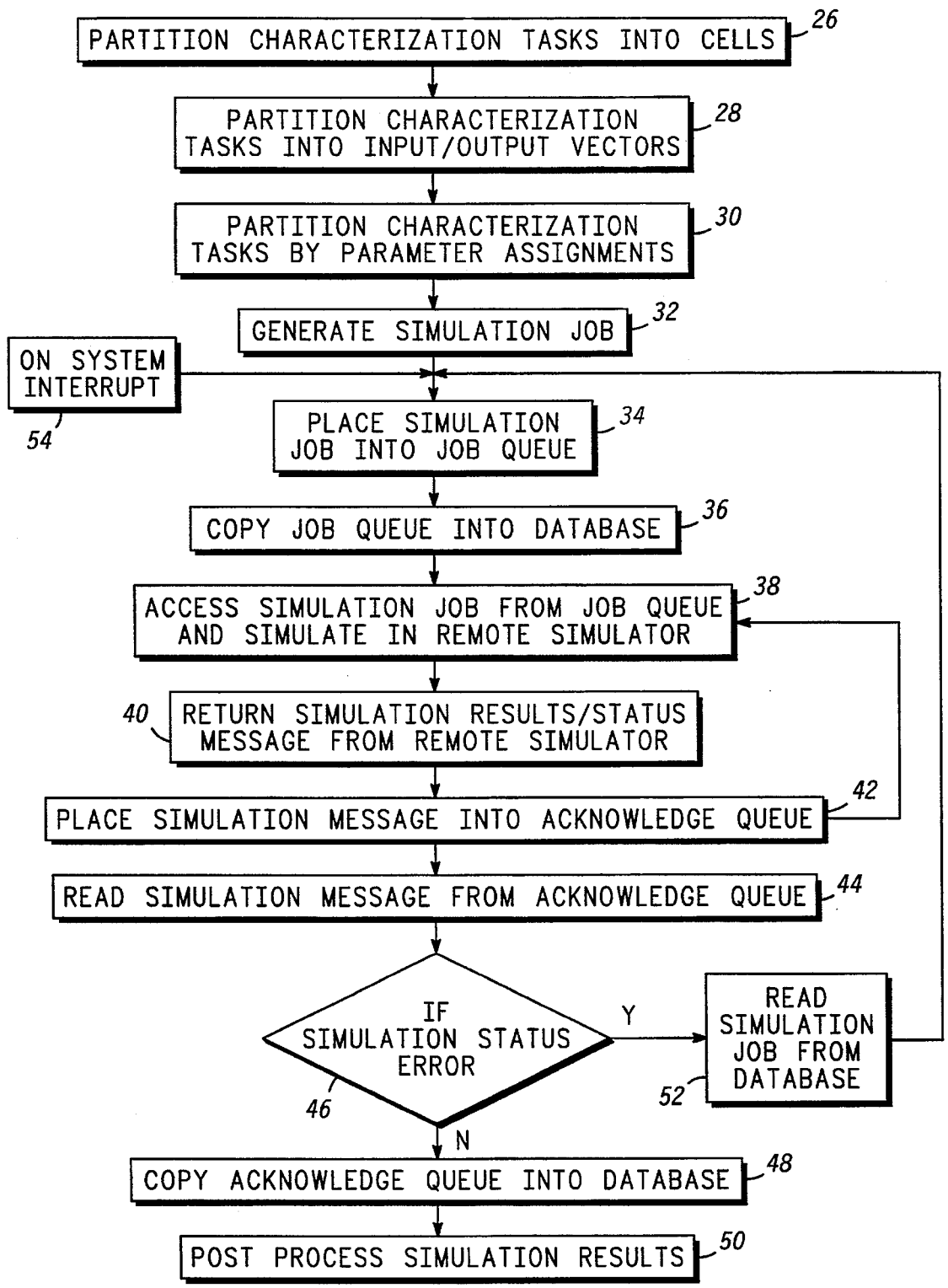
FIG. 2 is a flowchart illustrating the scheduling and processing steps of the distributed simulation system of FIG. 1.

The operational steps are detailed in FIG. 2. In steps 26, 28, and 30, the total task of characterizing a cell library is partitioned into independent simulation tasks. A cell library has considerable inherent parallelism due to four independent modes of parallelism available in cell characterization: cell parallelism, input/output state parallelism, parameter parallelism, and simulation parallelism. In step 26, cell parallelism is exploited by partitioning the characterization tasks by cells, since simulations of individual library cells are completely independent of each other. In step 28, input/output state parallelism is exploited by partitioning the characterization tasks by their input/output state assignments. Propagation delay or power are measured for a certain set of input and output states. Simulations for different states do not depend on each other. In step 30, parameter parallelism is exploited by partitioning the characterization tasks by their parameter assignments. The ranges of the simulation parameters T, ER, $V_{DD}$, L, C, I, and other parameters as defined above to form a multi-dimensional space. For each element in the space corresponding to a parameter assignment, a simulation has to be done.

Each circuit simulation may have enough internal parallelism to use many processing nodes of a parallel computer. The invention includes the first three modes of parallelism, as detailed in the previous steps. In addition, a commercial parallel Spice-like simulator may be integrated into the present invention.

As shown in FIG. 1, the invention incorporates persistent database 22. The database contains all data relevant to the characterization of the cell. Database 22 also contains the current status of master process 12 and a mirror image of job queue 14 and acknowledge queue 20. In the event of a crash of the Master/Slave programs, the system can be restarted at the last successful database transaction before the crash. Thus, a minimum number of simulations have to be repeated.

Master process 12 controls the database, and alternates between two modes of execution: a send phase as described in step 34, and a receive phase as described in step 44. In step 32, master process 12 extracts model parameters from database 22 and creates Spice input files. In step 34, master process 12 places commands for execution into job queue 14 in the tuple space. Load balancing is achieved by reordering job queue 14 so that simulations belonging to larger cells are moved closer to the tail of the queue. In step 36, master process 12 also updates the mirror image of job queue 14 in database 22 so that the database contains an up-to-date copy.

Each remote slave simulator 16–18 executes a processing loop. At the start of the loop in step 38, the remote simulator takes a job message from job queue 14. If the job message contains a special DIE message, the remote simulator ceases operation. Otherwise, the remote simulator uses information in the job message to start a Spice simulation with the UNIX system() call. In step 40, the remote simulator monitors the status and termination of the Spice run. The simulation results/status message is returned from remote simulators 16–18. In step 42, the remote simulator reports the results and status of the simulation back to master process 12 by placing the simulation message into acknowledge queue 20 in the tuple space. The remote simulator returns to step 38.

In step 44, master process 12 enters the receive phase by reading simulation messages from acknowledge queue 20. In step 46, master process 12 tests the status of the simulation that is attached to the acknowledge message. If master process 12 receives a message that a Spice job for a particular cell failed due to a program or hardware crash, the simulation job is read from database 22 and resubmitted to job queue 14 in step 34. If the failure is due to a parameter or netlist error, all other commands in the queue that operate on the same can removed, by replacing the message in job queue 14 with a DO-NOTHING message. In step 48, master process 12 stores the current state of acknowledge queue 20 into database 22 so that the database has an up-to-date copy. In step 50, master process 12 does post-processing on the cell once all of its simulations have finished execution.

Should the whole Entice system fail, the system interrupt can be detected in step 54 whereby the system can be restarted at the point of failure. Master process 12 retrieves the job and acknowledge queues from database 22 and restarts scheduling and execution of the remote simulations.

In summary, the present invention is a distributed computing facility that allows the simulations to be parallelized over a network of remote workstations, thereby reducing the simulation time dramatically. This form of parallel supercomputing is ideal for use in the hardware design community, since there are usually large numbers of fast workstations that are underutilized. The significant speedups obtained through distributed computing also allow for greater ranges of parameters to be simulated, and result in more accurate delay and power models. The distributed computing feature is designed for ease of data extraction, minimal network traffic and for fault tolerance, to recover from frequent workstation crashes without data corruption and wasted computing effort.

While specific embodiments of the present invention have been shown and described, further modifications and improvements will occur to those skilled in the art. It is understood that the invention is not limited to the particular forms shown and it is intended for the appended claims to cover all modifications which do not depart from the spirit and scope of this invention.

What is claimed is:

1. A computer implemented method of cell characterization in a distributed simulation system, comprising the steps of:

partitioning characterization tasks into individual simulations;

partitioning characterization tasks by cell libraries;

partitioning said characterization tasks within one of said cell libraries by input/output vectors;

partitioning said characterization tasks within said one of said cell libraries and within one of said input/output vectors by parameter assignments;

generating a simulation job based on said individual simulations and said cell libraries;

placing said simulation job into a simulation job queue;

accessing said simulation job and processing said simulation job in a remote simulator;

returning simulation status and simulation results from said remote simulator;

placing said simulation status and simulation results into an acknowledge queue;

reading said simulation status and results from said acknowledge queue;

copying said acknowledge queue into said database; and post-processing said simulation results.

2. The method of claim 1 further including the step of copying said job queue into a database.

3. The method of claim 2 further including the steps of:

reading said simulation job from said database upon detecting a simulation error; and placing said simulation job into said simulation job queue.

4. The method of claim 3 further including the steps of:

reading said simulation job from said database upon detecting a system interrupt; and placing said simulation job into said simulation job queue.

* * * * *